(12) United States Patent
Moseri et al.

(10) Patent No.: US 9,788,413 B2
(45) Date of Patent: Oct. 10, 2017

(54) ELECTROMAGNETIC INTERFERENCE SHIELDING ASSEMBLY AND METHOD OF PROVIDING ELECTROMAGNETIC INTERFERENCE SHIELDING

(71) Applicant: MOTOROLA SOLUTIONS, INC., Schaumburg, IL (US)

(72) Inventors: Yaakov Moseri, Shoham (IL); Alexander J. Gomelsky, Holon (IL); Lionid Kodner, Airport (IL)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 14/936,082

(22) Filed: Nov. 9, 2015

(65) Prior Publication Data
US 2017/0135199 A1    May 11, 2017

(51) Int. Cl.
H05K 7/20 (2006.01)
H05K 1/02 (2006.01)

(52) U.S. Cl.
CPC .................. H05K 1/0216 (2013.01)

(58) Field of Classification Search
CPC ..... H04B 1/036; H04B 1/3833; H04M 1/026; H05K 1/02; H05K 1/0216; H05K 7/20; H05K 7/20445; H05K 9/003; H05K 9/0026; H01L 2224/16; H01L 2224/16225; H01L 2224/32245; H01L 2224/73253; H01L 23/40; H01L 23/552; H01L 2924/0002; H01L 2924/3011; H01L 2924/3025; H01L 2924/01078; H01L 2924/01079; H01L 2924/01087; H01L 2924/16152; H01L 2924/16153
(Continued)

(56) References Cited

U.S. PATENT DOCUMENTS 5,235,131 A    8/1993  Mueller et al.
5,294,826 A    3/1994  Marcantonio et al.
(Continued)

FOREIGN PATENT DOCUMENTS

EP    1997363    12/2008
WO    2007103741    9/2007

*Primary Examiner* — Timothy Thompson
*Assistant Examiner* — Guillermo Egoavil
(74) *Attorney, Agent, or Firm* — Michael Best & Friedrich LLP

(57) ABSTRACT

An assembly and method provides improved electromagnetic interference shielding, particularly where the assembly includes a shield with a shield opening. The shield opening may be provided to permit the escape of thermal energy from an electronic component on a substrate under the shield or to receive at least a part of a thermal pad, electronic component, or conductive chassis. The assembly includes a first conductive gasket disposed around the shield opening, and a second conductive gasket disposed radially outward from the first conductive gasket. The first conductive gasket and the second conductive gasket have one or more gasket characteristics including a respective first characteristic and second characteristic that are of the same type but have different values. The first characteristic and the second characteristic may be one or more of different attenuation frequency ranges, compression amounts, compressive forces, and dimensions.

20 Claims, 6 Drawing Sheets

(58) Field of Classification Search
USPC ...... 165/80.3, 185; 174/16.3, 350, 351, 377, 174/384, 387; 257/E23.114; 361/707, 361/709, 719, 720, 816, 818; 455/575.1
See application file for complete search history.

(56) References Cited

U.S. PATENT DOCUMENTS

| | | | | |
|---|---|---|---|---|
| 6,269,008 | B1* | 7/2001 | Hsu | H05K 9/0032 |
| | | | | 174/353 |
| 6,624,432 | B1* | 9/2003 | Gabower | H04B 1/3838 |
| | | | | 174/384 |
| 7,221,244 | B2 | 5/2007 | Estes et al. | |
| 7,288,727 | B1 | 10/2007 | Garcia | |
| 7,317,618 | B2 | 1/2008 | Robinson et al. | |
| 7,952,881 | B2 | 5/2011 | Magana et al. | |
| 2002/0039658 | A1* | 4/2002 | Bunyan | F16J 15/064 |
| | | | | 428/450 |
| 2003/0193794 | A1* | 10/2003 | Reis | H01L 23/552 |
| | | | | 361/816 |
| 2003/0223211 | A1* | 12/2003 | Huang | H05K 9/0032 |
| | | | | 361/816 |
| 2004/0014508 | A1* | 1/2004 | Seo | H01Q 1/02 |
| | | | | 455/575.5 |
| 2006/0126309 | A1* | 6/2006 | Bolle | H05K 9/0033 |
| | | | | 361/719 |
| 2016/0234356 | A1* | 8/2016 | Thomas | H04B 1/3888 |

* cited by examiner

ELECTROMAGNETIC INTERFERENCE SHIELDING ASSEMBLY AND METHOD OF PROVIDING ELECTROMAGNETIC INTERFERENCE SHIELDING

BACKGROUND OF THE INVENTION

A general trend to reduce the size of modern electronic devices has generated a desire for devices that are more densely-populated with electrical components. These electronic devices often include technologies that comply with multiple sets of standards and further transmit and receive at several different frequencies. Despite their complexity, such electronic devices must still meet rigid reliability and useful life requirements, such as those set by military standards.

Electronic devices may be both sources of electromagnetic waves or interference and subjected to electromagnetic waves or interference from other devices. It will be appreciated that governmental regulations limit the magnitude and types of electromagnetic interference that can be emitted. Further, electromagnetic interference received from other devices can be disruptive to the receiving electronic devices and their electrical components.

Additionally, electrical components within the electronic device, in some circumstances, may generate heat that, when not managed properly, can damage the electrical components or otherwise disrupt operation of the electronic device.

It is therefore desirable to both provide an outlet for the thermal energy and provide shielding for electromagnetic interference.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1A:
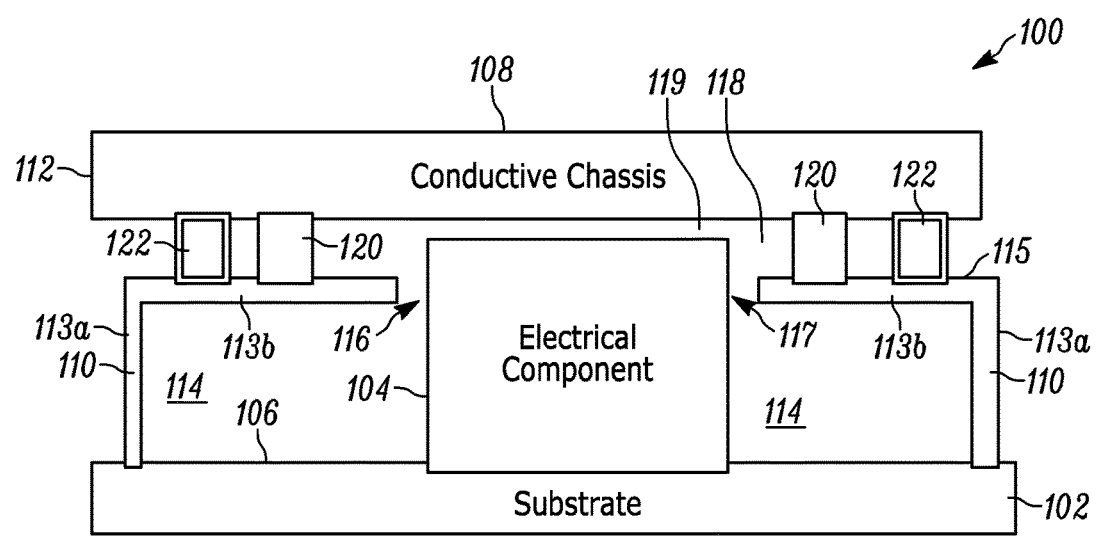
FIG. 1A is a side cross-sectional view of an electromagnetic interference shielding assembly in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

In one embodiment, an electromagnetic interference shielding assembly is provided. The electromagnetic interference shielding assembly includes a substrate having a mounting surface for at least one electrical component. The electromagnetic interference shield assembly further includes a conductive chassis spaced from the mounting surface of the substrate, the conductive chassis having an inner surface. The electromagnetic interference shielding assembly also includes a shield, a first conductive gasket, and a second conductive gasket. The shield is disposed between the mounting surface of the substrate and the inner surface of the conductive chassis, and the shield has an exterior surface and a shield opening. The first conductive gasket is disposed around the shield opening and is in engagement with both the inner surface of the conductive chassis and the exterior surface of the shield. The first conductive gasket also has one or more first gasket characteristics including a first characteristic of a first type. The second conductive gasket is disposed radially outward from the first conductive gasket and is in engagement with both the inner surface of the conductive chassis and the exterior surface of the shield. The second conductive gasket also has one or more second gasket characteristics including a second characteristic. The second characteristic is of the first type but has a different value than the first characteristic.

Another embodiment includes a method for providing electromagnetic interference shielding. The method includes positioning a shield on a mounting surface of a substrate, the shield having a shield opening, and positioning a conductive chassis such that the conductive chassis is spaced from the shield. The method further includes placing a first conductive gasket such that the first conductive gasket engages both the shield and the conductive chassis, and such that the first conductive gasket is disposed around the shield opening. The first conductive gasket has one or more first gasket characteristics including a first characteristic of a first type. The method also includes placing a second conductive gasket such that the second conductive gasket engages both the shield and the conductive chassis, and such that the second conductive gasket is disposed radially outward from the first conductive gasket. The second conductive gasket has one or more second gasket characteristics including a second characteristic of the first type and having a different value than the first characteristic.

FIG. 1A is a side cross-sectional view of an electromagnetic interference shielding assembly 100, also referred to as shielding assembly 100, according to some embodiments. In FIG. 1A, the shielding assembly 100 includes a substrate 102, an electrical component 104 disposed on a mounting surface 106 of the substrate 102, and a conductive chassis 108 spaced from the mounting surface 106 of the substrate 102. The substrate 102 is, for example, a printed circuit board (PCB). In some embodiments, the substrate 102 is mounted to the conductive chassis 108 through screws or other fasteners, which are not shown. The conductive chassis 108 is a thermally and electrically conductive component that is used, in part, as a heat sink to regulate the temperature of the electrical component 104 through conducting heat away from the electrical component 104 into a surrounding environment of the conductive chassis 108. Although the electrical component 104 is illustrated as a single electrical component, in some embodiments, the electrical component 104 includes one or more electrical components.

In FIG. 1A, a shield 110 is disposed between the mounting surface 106 and an inner surface 112 of the conductive chassis 108. The shield 110 includes a vertical portion 113a and a horizontal portion 113b that, with the mounting surface 106, define a first shielded area 114. The shield 110 further includes an exterior surface 115 and a shield opening 116. The shield opening 116 is an aperture in the shield 110 that joins the first shielded area 114 with a second shielded area 118. As illustrated, the electrical component 104 is partially within the first shielded area 114 and extends up through the shield opening 116 into the second shielded area 118.

Although the electrical component 104 extends into the shield opening 116, a portion of the shield opening 116 remains unoccupied by the electrical component 104. This unoccupied portion of the shield opening 116 between the shield 110 and the electrical component 104 is a thermal passageway 117. Thermal energy generated within the first shielded area 114 (e.g., by the electrical component 104) may pass through the thermal passageway 117 to reach the conductive chassis 108. While the shielding assembly 100 includes an air gap 119 between the electrical component 104 and the conductive chassis 108, in some embodiments, a thermal pad (not shown in FIG. 1A or 1B) is disposed between the electrical component 104 and the conductive chassis 108. Such a thermal pad provides another path for thermal energy emitted by the electrical component 104 (see, e.g., discussion of a thermal pad with respect to FIG. 3).

The shield 110 provides electromagnetic interference shielding for the electrical component 104. The shield 110 both limits electromagnetic interference generated by external devices from reaching the electrical component 104, and limits electromagnetic interference emitted by the electrical component 104 from reaching the environment outside of the shield 110, which may include external devices. These external devices may be part of the same overall device incorporating the shielding assembly 100 or may devices that are independent of the device incorporating the shielding assembly 100. The shield opening 116 provides a path for thermal energy generated by the electrical component 104 to flow through the shield 110 to the conductive chassis 108. While the shield opening 116 permits transmission of thermal energy, electromagnetic interference may also pass through the shield opening 116 to and from the electrical component 104. Additionally, the electrical component 104 includes a top portion that extends through the shield opening 116 and is exposed outside of the shield 110. The exposed, top portion may emit electromagnetic interference outside of the shield 110 and may receive electromagnetic interference outside of the shield 110.

A first conductive gasket 120 and a second conductive gasket 122 are disposed around the shield opening 116 (see FIG. 1B) and engage both the inner surface 112 of conductive chassis 108 and the exterior surface 115 of the shield 110 (see FIG. 1A). The second shielded area 118 is defined, at least in part, by the first conductive gasket 120, the conductive chassis 108, and the exterior surface 115 of the shield 110. The first conductive gasket 120 and the second conductive gasket 122 include metallized foam or other conductive materials that provide electromagnetic interference shielding. The first conductive gasket 120 and second conductive gasket 122, along with the conductive chassis 108, provide electromagnetic shielding around the second shielded area 118. This electromagnetic shielding (1) attenuates electromagnetic interference that is emitted by the electrical component 104 and passes through the shield opening 116 toward the outside environment; (2) attenuates electromagnetic interference that is generated within the second shielded area 118 by the electrical component 104 and emitted toward the outside environment; (3) attenuates electromagnetic interference from external devices that is inbound and heading toward the top portion of the electrical component 104 that is exposed outside of the shield 110; and (4) attenuates electromagnetic interference from external devices that is inbound and heading toward the shield opening 116 to pass through the shield 110 to the electrical component 104.

Figure 1B:
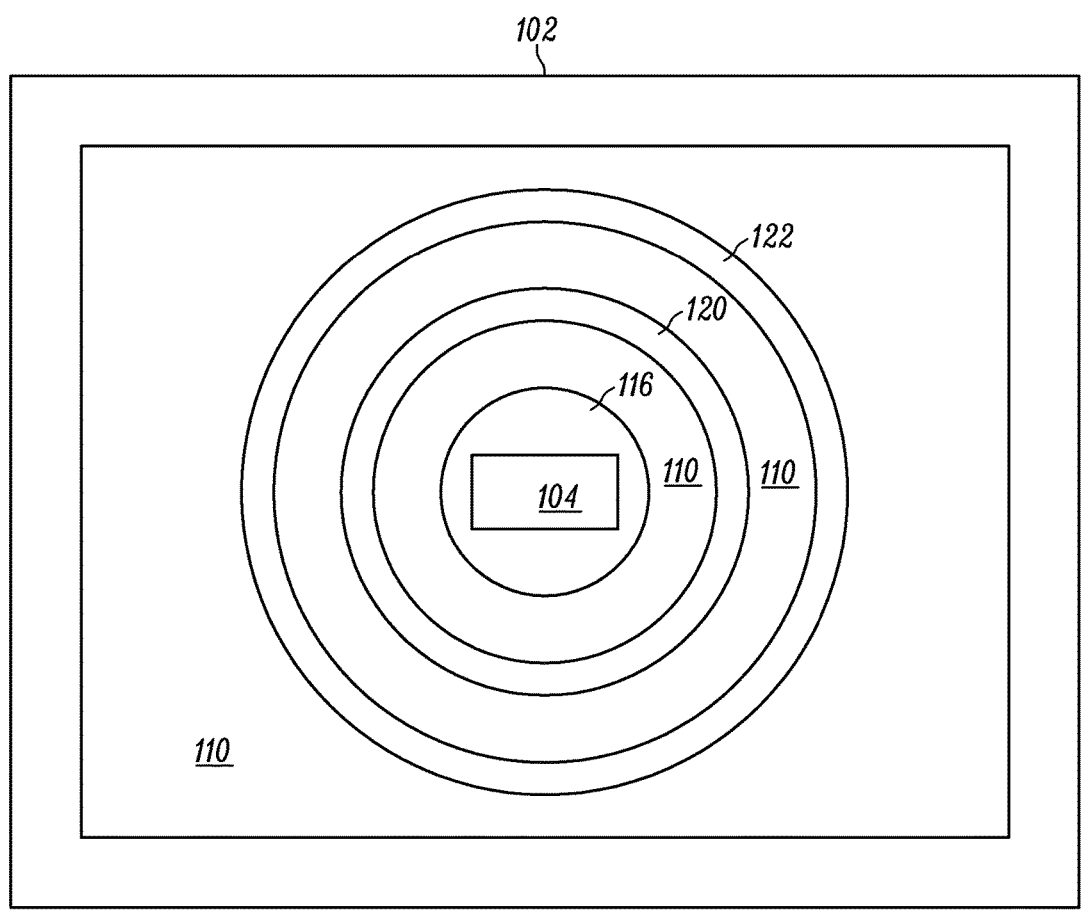
FIG. 1B is a top view of the electromagnetic interference shielding assembly of FIG. 1A.

FIG. 1B illustrates the shielding assembly 100 from a top-down view with the conductive chassis 108 removed. As shown in FIG. 1B, the first conductive gasket 120 and second conductive gasket 122 are disposed around the shield opening 116, with the second conductive gasket 122 radially outward of the first conductive gasket 120. The first conductive gasket 120 and the second conductive gasket 122 together form cascaded conductive gaskets. The shield opening 116, first conductive gasket 120, and second conductive gasket 122 are illustrated as being circular; however, in some embodiments, one or more has a different shape, such as a rectangle, a circle, a square, an oval, an ellipse, a polygon, or another irregular or regular closed shape.

Conductive gaskets, such as the first conductive gasket 120 and the second conductive gasket 122, are commercially available and can have various characteristics. For example, various gaskets and materials sold under the name Eco-Foam™, offered by Laird™, and the name GORE® EMI Shielding Materials (GS8000 series), offered by W. L. Gore & Associates, Inc., may be used as the conductive gaskets described herein.

In some embodiments, the conductive gaskets, such as the first conductive gasket 120 and the second conductive gasket 122, have one or more gasket characteristics that are of the same type but that have different values. These gasket characteristics may be physical properties (e.g., composition and dimensions), mechanical properties (e.g., compression amount and compressive force), and electrical properties (e.g., attenuation frequency ranges). To achieve these different values for their respective characteristics, the conductive gaskets may be manufactured from different materials, or may be comprised of the same material but have different specifications or dimensions. The use of two or more conductive gaskets having different values for the same characteristic may yield improved electromagnetic shielding of the electrical component, as discussed in further detail below. In some examples, the first conductive gasket 120 and the second conductive gasket 122 have one or more gasket characteristics with the same value and one or more gasket characteristics with a different value. For example, the first conductive gasket 120 and the second conductive gasket 122 may have the same compression amount, but different attenuation frequency ranges.

In the example shown in FIGS. 1A and 1B, the first conductive gasket 120 and second conductive gasket 122 are comprised of different materials. The first conductive gasket 120 has a first attenuation frequency range, and the second conductive gasket 122 has a second attenuation frequency range that is different from the first attenuation frequency range. In other embodiments, the first conductive gasket 120 and second conductive gasket 122 may have a different respective first compression amount and second compression amount, a different respective first uncompressed height and second uncompressed height, a different respective first compressive force and second compressive force, or a combination thereof. Additionally, as noted, while one or more of the gasket characteristics of the first conductive gasket 120 and the second conductive gasket 122 may be different, one or more other of the gasket characteristics may be the same. Furthermore, the embodiments described herein are not limited to the use of two spaced conductive gaskets. In some embodiments, it may be desirable to use more than two radially-spaced conductive gaskets having different values for the same type of characteristic to achieve improved attenuation of electromagnetic interference (see, e.g., FIGS. 3 and 5). When one or more additional conductive gaskets are used, the additional conductive gasket(s) may also have a different value for the same type of characteristic as the first conductive gasket 120 and the second conductive gasket 122.

The use of conductive gaskets having different values for the same type of characteristic may affect the conductive gaskets' respective attenuation of electromagnetic interference emitted from the electrical component 104, and may also affect the conductive gaskets' respective magnitude of attenuation of electromagnetic interference from outside sources. The electromagnetic attenuation by each of the radially-disposed conductive gaskets tends to be additive so that the total attenuation magnitude of the conductive gaskets is approximately equal to the sum of the individual attenuation magnitudes (in decibels) of each conductive gasket.

Figure 2:
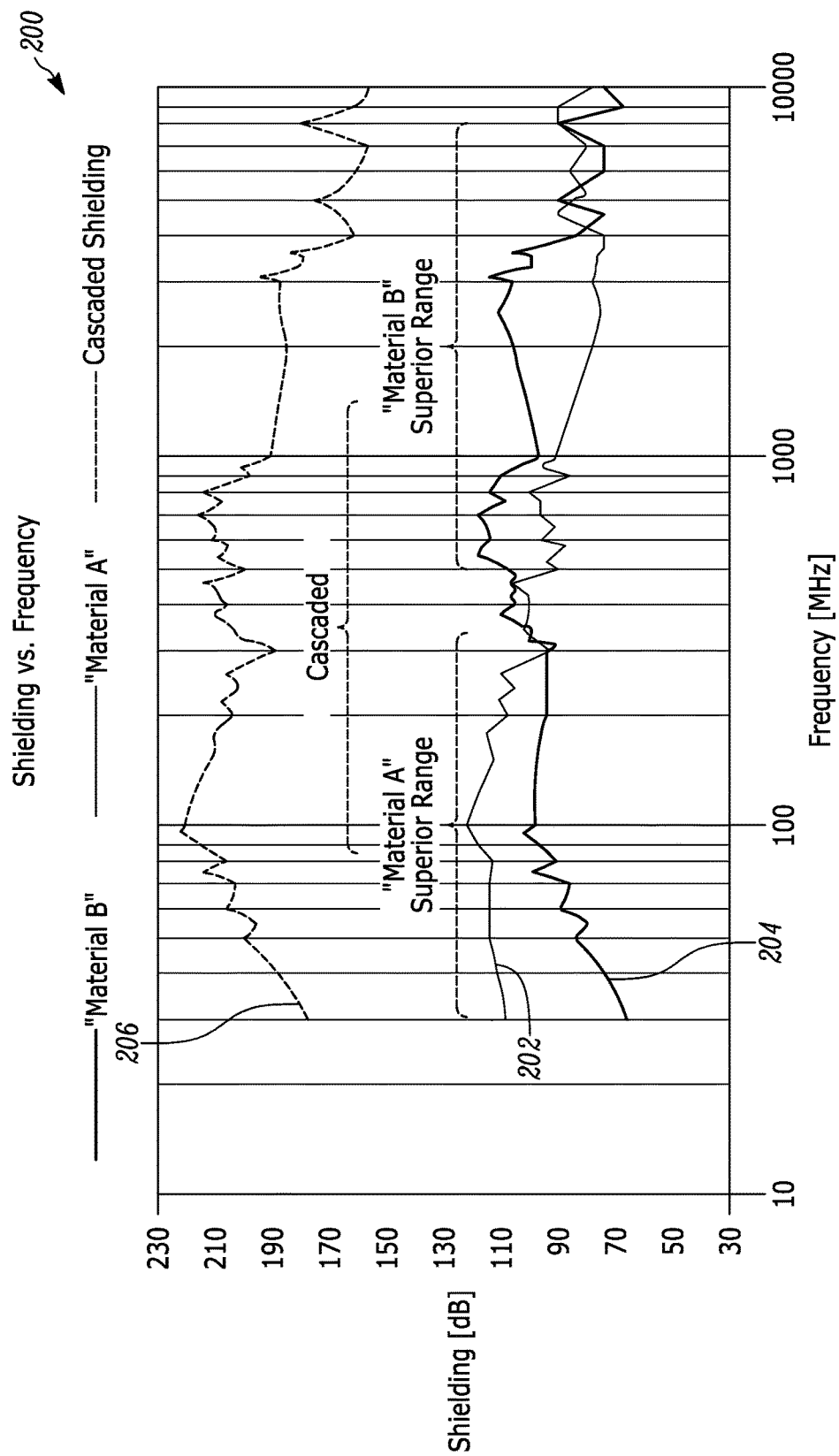
FIG. 2 is a graph of frequency versus shielding corresponding to an electromagnetic interference shield having two radially-disposed conductive gaskets.

FIG. 2 is an illustrative graph 200 of frequency versus shielding when two conductive gaskets are comprised of different materials, namely Material A and Material B. In the testing to generate graph 200, Material A was a conductive gasket comprised of metalized foam with fabric tape sold under the name ECOFoam™ CF520 by Laird, and Material B was a conductive gasket comprised of a metallized fabric and sold under the name MRI "A" Fabric (3027-532C) by Laird™. As noted above, various materials may be used as the conductive gaskets described herein and these particular Materials A and B are but two examples. Graph 200 has a first curve 202 corresponding to the attenuation frequency of Material A. Although the first curve 202 indicates that Material A yields attenuation frequency from 20 megahertz (MHz) through 10,000 megahertz (10 gigahertz), the superior range of attenuation is from 20 through about 125 megahertz.

The graph 200 also includes a second curve 204 corresponding to the attenuation frequency of Material B. Although the second curve 204 indicates that there is attenuation frequency from 20 megahertz through 10,000 megahertz (10 gigahertz), the superior attenuation range of Material B is from about 140 megahertz to about 8,000 megahertz (8 gigahertz). To achieve these varying attenuation ranges, Material A and Material B have different compositions (e.g., metallized foam with fabric tape and metallized fabric, respectively) and may have one or more other differing gasket characteristics such as compression amount, dimensions, uncompressed height, and compressive force.

Referring again to graph 200 of FIG. 2, a curve 206 corresponds to the attenuation frequency that may be achieved when two radially-disposed or cascaded conductive gaskets are used, with one conductive gasket made from Material A and the other conductive gasket made from Material B. The attenuation achieved by using the two gaskets is generally additive in nature. For example, at a frequency of about 200 megahertz, each of first curve 202 and second curve 204 indicates an attenuation of about 90 decibels, while the attenuation indicated by curve 206 at about 200 megahertz is about 185 decibels. In addition to an increased magnitude of attenuation, curve 206 indicates that the use of two radially-disposed conductive gaskets extends the range of superior attenuation to between 20 and 10,000 megahertz.

Since the attenuations of radially-disposed conductive gaskets are generally additive, the compressive force on each radially-disposed conductive gasket may be reduced. Instead of applying a high compressive force to a single conductive gasket to yield a desired attenuation magnitude, the compressive forces applied to each of the radially-disposed conductive gaskets may be reduced while at the same time achieving improved attenuation. Reducing the compressive force on a conductive gasket may extend its useful life and its reliability.

For example, a particular conductive gasket may have an uncompressed height of 0.45 millimeters. When this conductive gasket is compressed to 0.30 millimeters by a 50 pounds per square inch (PSI) compression force, the conductive gasket provides 50 decibels of attenuation. When compressed to a height of 0.15 millimeters by a 325 pounds per square inch compression force, the conductive gasket provides an increase in shielding with 65 decibels of attenuation. When two of these conductive gaskets are put under the lower pressure of 50 pounds per square inch compression force and they are cascaded (see, e.g., the first conductive gasket 120 and the second conductive gasket 122 of FIG. 1B), the approximate attenuation is 100 decibels. Accordingly, the cascaded conductive gaskets provide improved shielding with reduced compressive forces that may extend the useful life and reliability of the conductive gaskets. These particular conductive gaskets, attenuation levels, compression forces, and gasket heights are provided merely for illustrative purposes, as other conductive gaskets, attenuation levels, compression forces, and gasket heights are present in embodiments discussed herein.

Figure 3:
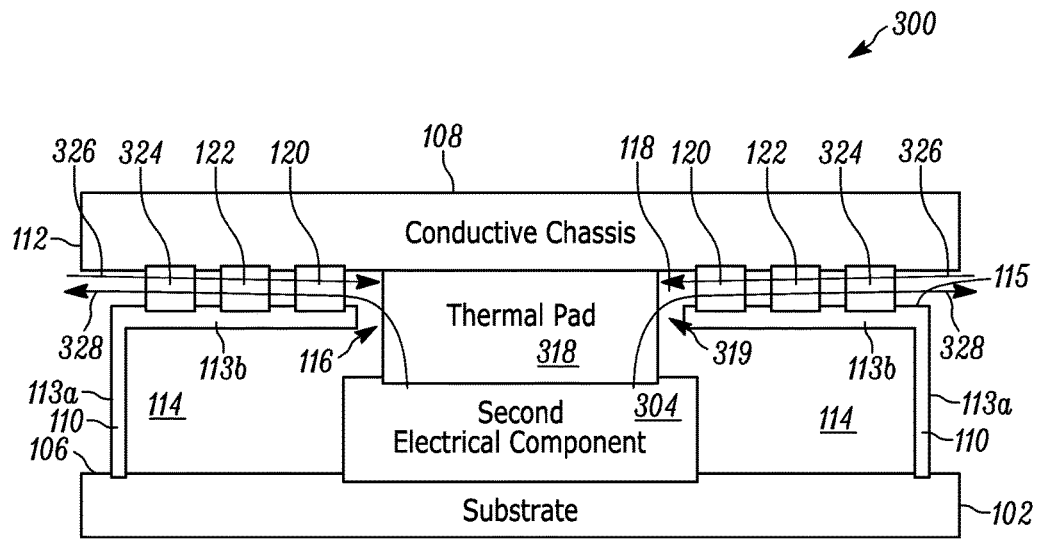
FIG. 3 is a side cross-sectional view of a second electromagnetic interference shielding assembly in accordance with some embodiments.
Figure 4:
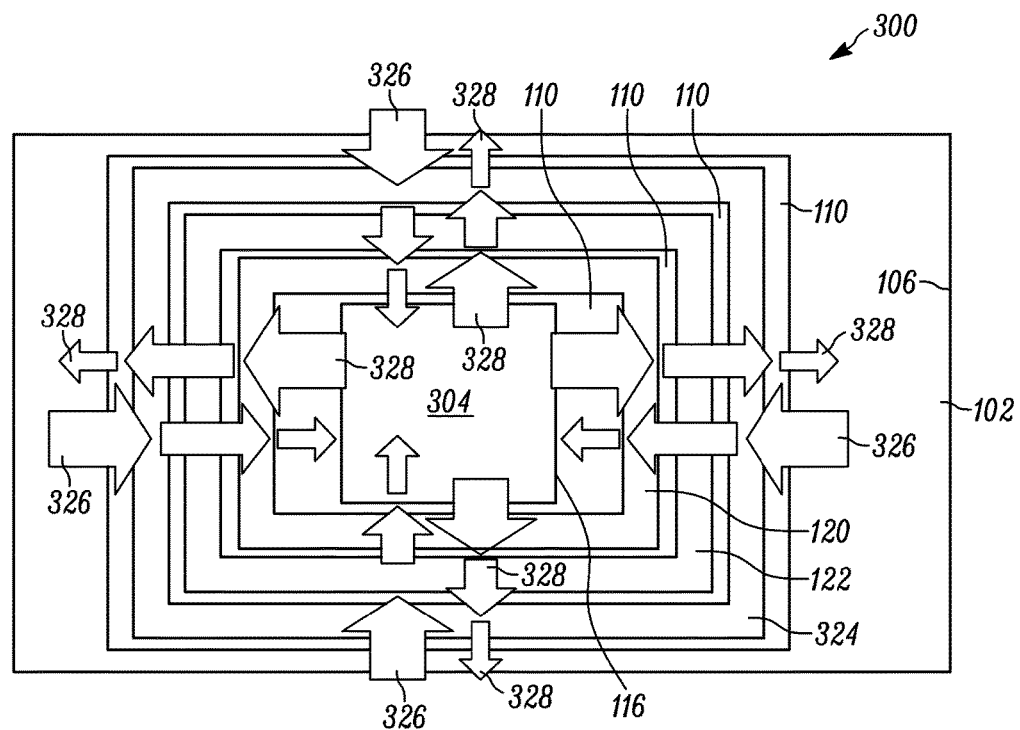
FIG. 4 is a top view of the second electromagnetic interference shielding assembly of FIG. 3.

FIG. 3 is a side cross-sectional view of a second electromagnetic interference shield assembly 300, also referred to the second shielding assembly 300. Like components between FIGS. 1 and 3 are given the same label. FIG. 4 is a top view of the second shielding assembly 300 of FIG. 3. In FIGS. 3 and 4, the second shielding assembly 300 includes the substrate 102, a second electrical component 304 disposed on the mounting surface 106 of the substrate 102, and the conductive chassis 108 spaced from the mounting surface 106 of the substrate 102.

Similar to the assembly of FIG. 1A, in FIG. 3, the shield 110 is disposed between the mounting surface 106 and the inner surface 112 of the conductive chassis 108. The shield 110 has the exterior surface 115 and the shield opening 116. The second electrical component 304 is disposed beneath the shield opening 116. In other words, in this embodiment, the second electrical component 304 does not extend through the shield opening into the second shielded area 118. A thermal pad 318 may be disposed in the shield opening 116 and between the second electrical component 304 and conductive chassis 108 to provide a thermally conductive path for thermal energy emitted by the second electrical component 304. Although the thermal pad 318 extends into the shield opening 116, a portion of the shield opening 116 surrounding the thermal pad 318 remains unoccupied by the thermal pad 318. This unoccupied portion of the shield opening 116 between the shield 110 and the thermal pad 318 is a second thermal passageway 319. Thermal energy generated within the first shielded area 114 (e.g., by the electrical component 104) may pass through the second thermal passageway 319 out of the first shielded area 114 to reach the conductive chassis 108.

The embodiment shown in FIGS. 3 and 4 includes three radially-disposed conductive gaskets: the first conductive gasket 120, the second conductive gasket 122, and a third conductive gasket 324. The first conductive gasket 120 is disposed around shield opening 116. The first conductive gasket 120 engages both the inner surface 112 of conductive chassis 108 and the exterior surface 115 of the shield 110. The second conductive gasket 122 is disposed around shield opening 116 and radially outward from first conductive gasket 120. The second conductive gasket 122 also engages both the inner surface 112 of the conductive chassis 108 and the exterior surface 115 of the shield 110. The third conductive gasket 324 is disposed around the shield opening 116 and radially outward from the second conductive gasket 122. The third conductive gasket 324 also engages both the inner surface 112 of the conductive chassis 108 and the exterior surface 115 of shield 110.

The first conductive gasket 120, second conductive gasket 122, and third conductive gasket 324 include one or more gasket characteristics, such as physical properties (e.g., dimensions), mechanical properties (e.g., compression amount and compressive force), and electrical properties (e.g., attenuation frequency ranges). In FIGS. 3 and 4, the first conductive gasket 120, second conductive gasket 122, and third conductive gasket 324 may have different values for one or more the same type of gasket characteristic. For example, the first conductive gasket 120 has a first attenuation frequency range, the second conductive gasket 122 has a second attenuation frequency range, and the third conductive gasket 324 has a third attenuation frequency range. In other embodiments, the three conductive gaskets may have a different first uncompressed height, second uncompressed height, and third uncompressed height with respect to one another. In some embodiments, the three conductive gaskets may have one or more gasket characteristics that are of the same type but have different values, and one or more other gasket characteristics that are of the same type and with the same values.

In FIGS. 3 and 4, arrows 326 indicate exemplary paths of electromagnetic interference from outside sources. The first conductive gasket 120, second conductive gasket 122, and third conductive gasket 324 are positioned in these paths to attenuate such electromagnetic interference. Arrows 328 indicate exemplary paths of electromagnetic waves emitted by the second electrical component 304. The conductive gaskets are positioned in these paths to attenuate such electromagnetic waves.

Figure 5:
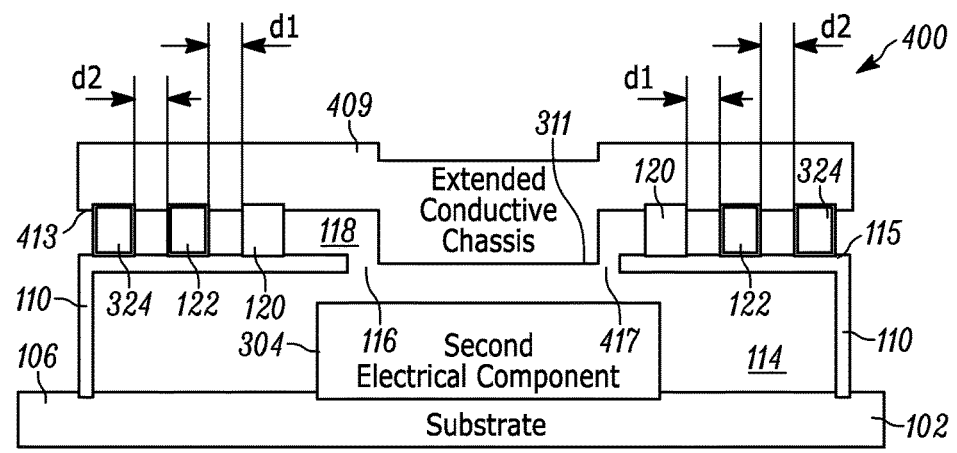
FIG. 5 is a side cross-sectional view of a third electromagnetic interference shielding assembly of in accordance with some embodiments.

FIG. 5 depicts a third electromagnetic interference shielding assembly 400, also referred to as third shielding assembly 400. The third shielding assembly 400 is similar to the second shielding assembly 300 depicted in FIGS. 3 and 4 except that the optional thermal pad is not shown, the conductive chassis has a different configuration, and the second conductive gasket 122 and third conductive gasket 324 have been particularly and differently spaced.

In FIG. 5, an extended conductive chassis 409 is provided that has an inner gasket surface 413, which engages the first conductive gasket 120, second conductive gasket 122 and third conductive gasket 324. Extended conductive chassis 409 also has an extension 414 that extends into the shield opening 116. The shield opening 116 is used in the FIG. 5 embodiment, at least in part, to avoid a mechanical interference between the shield 110 and the extended conductive chassis 409. In other words, if the shield 110 was not provided with the shield opening 116, the extension 414 would abut the shield 110 and prevent proper vertical positioning of the extended conductive chassis 409. The embodiment shown in FIG. 5 is otherwise configured and operates like the embodiment shown in FIGS. 3 and 4. In FIGS. 3, 4 and 5, like components have the same part numbers.

Although the extension 414 extends into the shield opening 116, a portion of the shield opening 116 surrounding the extension 414 remains unoccupied by the extension 414. This unoccupied portion of the shield opening 116 between the shield 110 and the extension 414 is a third thermal passageway 417. Thermal energy generated within the first shielded area 114 (e.g., by the electrical component 104) may pass through the third thermal passageway 417 out of the first shielded area 114 to reach the extended conductive chassis 409.

When the attenuation at a particular frequency is insufficient for the second electrical component 304, the attenuation at that frequency may be improved by spacing the first conductive gasket 120, second conductive gasket 122, and third conductive gasket 324 at particular distances from each other. Referring to FIG. 5 and assuming optimal attenuation at or near a frequency f1, the second conductive gasket 122 is spaced radially outward from first conductive gasket 120 by a distance d1 such that $$d1 = \lambda 1/4$$

where $$\lambda 1 = c/f1$$

c is the speed of light, $3 \times 10^8$ meters/second $\lambda 1$ is a wavelength in meters corresponding to frequency f1; and f1 is a first attenuation frequency in hertz (Hz).

Again referring to FIG. 5, optimal attenuation may be achieved at a second frequency f2 by spacing the third conductive gasket 324 radially outward from second conductive gasket 122 by a distance d2 such that $$d2 = \lambda 2/4$$

where $$\lambda 2 = c/f2$$

c is the speed of light, $3 \times 10^8$ meters/second $\lambda 2$ is a wavelength in meters corresponding to frequency f2; and f2 is a second attenuation frequency in hertz (Hz).

As with the other embodiments depicted and described herein, the embodiment of FIG. 5 may include more than three spaced conductive gaskets, and the conductive gaskets may be spaced to achieve optimal attenuation of electromagnetic interference at certain frequency ranges. In some embodiments, a substrate (e.g., the substrate 102) may have more than one cascaded electromagnetic shield including a conductive chassis (e.g., the extended conductive chassis 409), shield (e.g., the shield 110), and conductive gaskets (e.g., the first conductive gasket 120, the second conductive gasket 122, and the third conductive gasket 324). The conductive chassis, the shield, and the conductive gaskets of each cascaded electromagnetic shield form a Faraday cage for the respective electrical device.

Moreover, the conductive gaskets described herein need not be rectangular in a horizontal plane. The conductive gaskets can have any other geometric shape in the horizontal plane as space limitations and the configuration of the respective electrical components require, such as a circle, a square, an oval, an ellipse, a polygon, or another irregular or regular closed shape.

Figure 6:
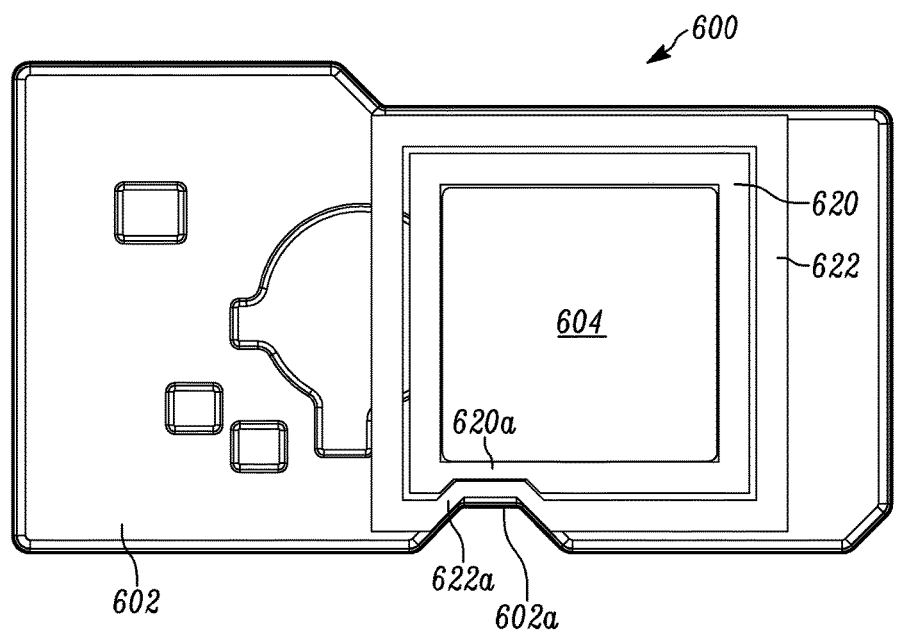
FIG. 6 is a top view of an irregularly shaped electromagnetic interference shielding assembly in accordance with some embodiments.
Figure 7:
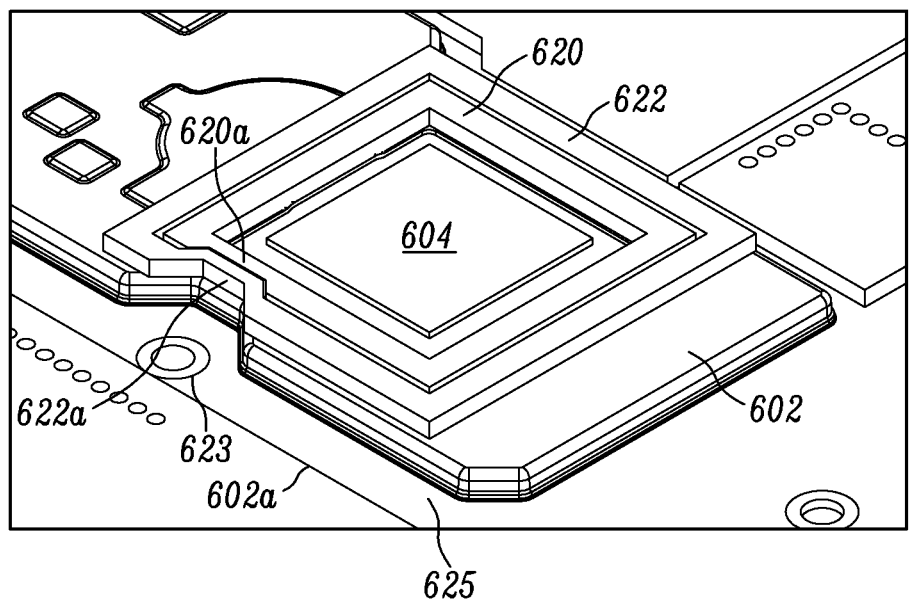
FIG. 7 is a magnified perspective view of the irregularly shaped electromagnetic interference shield assembly of FIG. 6.

FIGS. 6 and 7 illustrate an irregularly shaped electromagnetic interference shielding assembly 600, also referred to as irregularly shaped shielding assembly 600. The irregularly shaped shielding assembly 600 includes an irregularly shaped substrate 602 having a third electrical component 604 disposed thereon. The third electrical component 604 may be, for example, a central processing unit (CPU), having a form similar to the electrical component 104 or the second electrical component 304. The conductive chassis and other components are present on the irregularly shaped shielding assembly 600, but they have been omitted from these views to aid in the description.

As shown in FIGS. 6 and 7, a first irregular conductive gasket 620 and a second irregular conductive gasket 622 are disposed around the third electrical component 604. The first irregular conductive gasket 620 and second irregular conductive gasket 622 are irregular in that they each have irregular shapes in their respective first section 620a and second section 622a, as does irregularly shaped substrate 602 in a substrate section 602a. These irregular shapes are used to avoid an obstruction or mechanical interference with a fastener aperture 623 formed in a support board 625, and also to avoid a mechanical interference with a fastener which may be received in fastener aperture 623.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10 percent, in another embodiment within 5 percent, in another embodiment within 1 percent and in another embodiment within 0.5 percent. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An electromagnetic interference shielding assembly, the electromagnetic interference shielding assembly comprising:
    a substrate having a mounting surface for at least one electrical component;
    a conductive chassis spaced from the mounting surface of the substrate, the conductive chassis having an inner surface;
    a shield disposed between the mounting surface of the substrate and the inner surface of the conductive chassis, the shield having an exterior surface and a shield opening;
    a first conductive gasket disposed around the shield opening and in engagement with both the inner surface of the conductive chassis and the exterior surface of the shield, the first conductive gasket having one or more first gasket characteristics including a first characteristic of a first type; and
    a second conductive gasket disposed radially outward from the first conductive gasket, the second conductive gasket in engagement with both the inner surface of the conductive chassis and the exterior surface of the shield, wherein the second conductive gasket has one or more second gasket characteristics including a second characteristic, wherein the second characteristic is of the first type but has a different value than the first characteristic.

2. The electromagnetic interference shielding assembly of claim 1, wherein the first type is selected from the group consisting of a compression amount, uncompressed height, compressive force, and attenuation frequency range.

3. The electromagnetic interference shielding assembly of claim 1, wherein the one or more first gasket characteristics include a third characteristic of a second type that is different than the first type, and the one or more second gasket characteristics include a fourth characteristic that is of the second type, wherein the third characteristic and the fourth characteristic have the same value.

4. The electromagnetic interference shielding assembly of claim 3, wherein the first type and the second type are selected from the group consisting of compression amount, uncompressed height, compressive force, and attenuation frequency range.

5. The electromagnetic interference shielding assembly of claim 1, wherein the one or more first gasket characteristics include a third characteristic of a second type that is different than the first type, and the one or more second gasket characteristics include a fourth characteristic that is of the second type but has a different value than the third characteristic.

6. The electromagnetic interference shielding assembly of claim 5, wherein the first type and the second type are selected from the group consisting of compression amount, uncompressed height, compressive force, and attenuation frequency range.

7. The electromagnetic interference shielding assembly of claim 1, further comprising:
a thermal passageway extending through the shield opening.

8. The electromagnetic interference shielding assembly of claim 1, wherein the conductive chassis, the shield, the first conductive gasket, and the second conductive gasket form a Faraday cage.

9. The electromagnetic interference shielding assembly of claim 1, further comprising:
a first shielded area defined by the shield and the mounting surface; and
a second shielded area defined by the conductive chassis, the first conductive gasket, and
wherein the shield opening joins the first shielded area with the second shielded area.

10. The electromagnetic interference shielding assembly of claim 1, further comprising:
an electrical component mounted to the mounting surface; and
a thermal pad coupling the electrical component to the conductive chassis.

11. An electromagnetic interference shielding assembly, the electromagnetic interference shielding assembly comprising:
a substrate having a mounting surface for at least one electrical component;
a conductive chassis spaced from the mounting surface of the substrate, the conductive chassis having an inner surface;
a shield disposed between the mounting surface of the substrate and the inner surface of the conductive chassis, the shield having an exterior surface and a shield opening;
a first conductive gasket disposed around the shield opening and in engagement with both the inner surface of the conductive chassis and the exterior surface of the shield, the first conductive gasket having one or more first gasket characteristics including a first characteristic of a first type;
a second conductive gasket disposed radially outward from the first conductive gasket, the second conductive gasket in engagement with both the inner surface of the conductive chassis and the exterior surface of the shield, wherein the second conductive gasket has one or more second gasket characteristics including a second characteristic, wherein the second characteristic is of the first type but has a different value than the first characteristic; and
a third conductive gasket disposed radially outward from the second conductive gasket.

12. The electromagnetic interference shielding assembly of claim 11, wherein the third conductive gasket has one or more third gasket characteristics including a fifth characteristic of the first type, and wherein the fifth characteristic has a different value than the first characteristic and than the second characteristic.

13. A method of providing electromagnetic interference shielding, the method comprising:
positioning a shield on a mounting surface of a substrate, the shield having a shield opening;
positioning a conductive chassis such that the conductive chassis is spaced from the shield;
placing a first conductive gasket such that the first conductive gasket engages both the shield and the conductive chassis, and such that the first conductive gasket is disposed around the shield opening, the first conductive gasket having one or more first gasket characteristics including a first characteristic of a first type; and
placing a second conductive gasket such that the second conductive gasket engages both the shield and the conductive chassis, and such that the second conductive gasket is disposed radially outward from the first conductive gasket, the second conductive gasket having one or more second gasket characteristics including a second characteristic of the first type and having a different value than the first characteristic.

14. The method of claim 13, further comprising:
providing the first conductive gasket such that the first characteristic is a first uncompressed height; and
providing the second conductive gasket such that the second characteristic is a second uncompressed height.

15. The method of claim 13, further comprising:
providing the first conductive gasket such that the first characteristic is a first attenuation frequency range; and
providing the second conductive gasket such that the second characteristic is a second attenuation frequency range.

16. The method of claim 13, further comprising:
providing the first conductive gasket and the second conductive gasket such that the first type is selected from the group consisting of compression amount, uncompressed height, attenuation frequency range, and compressive force.

17. A method of providing electromagnetic interference shielding, the method comprising:
positioning a shield on a mounting surface of a substrate, the shield having a shield opening;
positioning a conductive chassis such that the conductive chassis is spaced from the shield;
placing a first conductive gasket such that the first conductive gasket engages both the shield and the conductive chassis, and such that the first conductive gasket is disposed around the shield opening, the first conductive gasket having one or more first gasket characteristics including a first characteristic of a first type;
placing a second conductive gasket such that the second conductive gasket engages both the shield and the conductive chassis, and such that the second conductive gasket is disposed radially outward from the first conductive gasket, the second conductive gasket having one or more second gasket characteristics including a second characteristic of the first type and having a different value than the first characteristic;

providing a third conductive gasket having one or more third gasket characteristics including a third characteristic that is of the first type; and placing the third conductive gasket radially outward from the second conductive gasket.

18. The method of claim 17, further comprising:

providing the third conductive gasket such that the third characteristic has a different value from the first characteristic and from the second characteristic.

19. The method of claim 18, further comprising:

providing the first conductive gasket such that the first characteristic is a first uncompressed height;

providing the second conductive gasket such that the second characteristic is a second uncompressed height; and providing the third conductive gasket such that the third characteristic is a third uncompressed height.

20. The method of claim 18, further comprising:

providing the first conductive gasket such that the first characteristic is a first attenuation frequency range;

providing the second conductive gasket such that the second characteristic is a second attenuation frequency range; and providing the third conductive gasket such that the third characteristic is a third attenuation frequency range.

* * * * *